United States Patent
Lansford

(10) Patent No.: US 6,352,870 B1
(45) Date of Patent: Mar. 5, 2002

(54) METHOD OF ENDPOINTING PLASMA STRIP PROCESS BY MEASURING WAFER TEMPERATURE

(75) Inventor: Jeremy Lansford, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 46 days.

(21) Appl. No.: 09/591,967

(22) Filed: Jun. 12, 2000

(51) Int. Cl.[7] .......................... G01R 31/26; H01L 21/00
(52) U.S. Cl. ........................ 438/17; 438/9; 156/626
(58) Field of Search .................. 438/8, 9, 17; 156/626, 156/626.1

(56) References Cited

U.S. PATENT DOCUMENTS

| 5,413,941 A | * | 5/1995 | Koos et al. ................. 156/626 |
| 5,433,813 A | * | 7/1995 | Kuwabara .................. 156/345 |
| 5,439,551 A | * | 8/1995 | Meikle et al. ............ 156/626.1 |
| 5,499,733 A | * | 3/1996 | Litvak .......................... 216/38 |
| 5,695,660 A | * | 12/1997 | Litvak .......................... 216/85 |
| 5,872,043 A | * | 2/1999 | Chen .......................... 438/424 |
| 5,891,352 A | * | 4/1999 | Litvak .......................... 216/85 |
| 6,077,452 A | * | 6/2000 | Litvak .......................... 216/85 |
| 6,110,752 A | * | 8/2000 | Litvak ............................ 438/8 |

FOREIGN PATENT DOCUMENTS

DE  004419476 A1 * 12/1994 ........... G01B/11/06

* cited by examiner

Primary Examiner—Charles Bowers
Assistant Examiner—David S Blum
(74) Attorney, Agent, or Firm—Williams, Morgan & Amerson, P.C.

(57) ABSTRACT

In one illustrative embodiment, the method disclosed herein comprises forming a process layer above a semiconducting substrate, forming a layer of photoresist above the process layer, removing the layer of photoresist by performing an etching process, and determining an endpoint of the etching process based upon a temperature of the substrate.

24 Claims, 3 Drawing Sheets

METHOD OF ENDPOINTING PLASMA STRIP PROCESS BY MEASURING WAFER TEMPERATURE

BACKGROUND OF THE INVENTION

1. Field of the Invention

The present invention is generally directed to the field of semiconductor processing, and, more particularly, to a method of removing photoresist from above a surface of a process layer formed above a surface of a semiconducting substrate.

2. Description of the Related Art

In general, semiconductor devices are manufactured by forming many process layers comprised of various materials above a semiconducting substrate, and, thereafter, removing selected portions of the layers, i.e., patterning the layers. This patterning may be accomplished using known photolithography and etching processes to define the various features of the device, e.g., the gate insulation layer, the gate electrode, sidewall spacers, metal lines and contacts, etc. This forming and patterning of the process layers is typically performed layer by layer as the individual layers are formed, although multiple layers may be patterned at any given time.

Photolithography is a common process used in patterning these various layers. Photolithography typically involves the use of a product known as photoresist. In general terms, photoresist is a product whose solubility in a developer may be manipulated by exposure to a light source. There are positive and negative photoresists currently available on the market.

In general, the photolithography process involves forming a layer of photoresist above a previously formed process layer, and exposing selected portions of the layer of photoresist to a light source to form a pattern in the photoresist that is desired to be formed in the under lying process layer. All of these steps are typically performed in well-known photolithography modules that include a section for depositing the photoresist on the wafer, e.g., a spincoating station, a device for selectively exposing portions of the photoresist layer to a light source through a reticle, e.g., a stepper, and a section for rinsing and developing the photoresist layer after it has been selectively exposed to the light source. Thereafter, an etching process, such as a plasma etching process, is performed to remove portions of the underlying process layer that are not covered by the patterned layer of photoresist, i.e., the patterned layer of photoresist acts as a mask. After the etching process is complete, the patterned photoresist layer is removed so that additional process layers may be formed above the now patterned process layer.

One technique used to remove the photoresist is plasma stripping, also sometimes referred to as ashing. During this process, the wafer is placed into a plasma etch tool, and an etching process is performed, typically in an oxygen-based environment, such that the photoresist is oxidized to form gaseous products, which are pumped away. Optical emission spectrometry may be used to detect when this process is complete, or to "endpoint" the process. Optical emission spectrometry involves detecting different wavelengths of light or energies depending upon the material contained in the reaction product gases of the plasma strip process. The plasma strip process continues until the optical spectrometry analysis indicates that there is no more photoresist being consumed in the process. At that point, the process is deemed complete. Optical emission spectrometry may be used initially in combination with other techniques. For example, a timed etch process may be used to remove the bulk of the layer of photoresist, and optical emission testing may only be performed for the last 10–20% of the photoresist layer to endpoint the process.

Endpointing the photoresist removal process using optical emission spectrometry has many deficiencies. For example, optical emission spectrometry does not provide any spatial information as to differences in rates of removal of the layer of photoresist across the surface of the wafer. That is, using optical emission spectrometry, it is not known whether the photoresist at the edge of the wafer has been completely removed while photoresist remains at the center of the wafer, or vice versa. Moreover, since the endpoint is not signaled until all or substantially all of the photoresist is removed, portions of the underlying process layer in areas where the photoresist has been removed first may be unnecessarily subjected to more of the plasma stripping process than would otherwise be necessary. This situation may be problematic for several reasons. For example, the underlying process layer is undesirably exposed to charged particles in the plasma strip process, and this may lead to electrically charging the exposed surface of the process layer, which can potentially lead to device degradation and yield loss.

The present invention is directed to a method that minimizes or reduces some or all of the aforementioned problems.

SUMMARY OF THE INVENTION

The present invention is directed to a method of endpointing photoresist removal processes based upon the temperature of the wafer. In one illustrative embodiment, the method disclosed herein comprises forming a process layer above a semiconducting substrate, forming a layer of photoresist above the process layer, removing the layer of photoresist by performing an etching process, and determining an endpoint of the etching process based upon a temperature of the substrate.

BRIEF DESCRIPTION OF THE DRAWINGS

The invention may be understood by reference to the following description taken in conjunction with the accompanying drawings, in which like reference numerals identify like elements, and in which.

Figure 1:
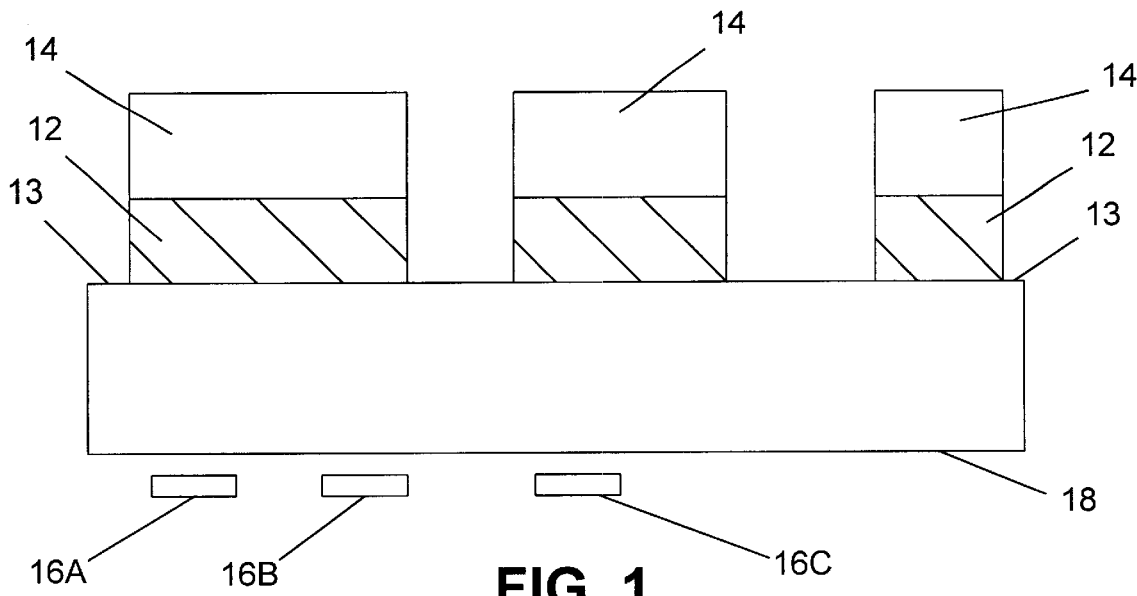
FIG. 1 is a cross-sectional view of a semiconducting substrate having an illustrative patterned process layer formed thereabove.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 1–4. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to a method of endpointing a plasma strip or ashing process used to remove photoresist by measuring wafer temperature. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, etc.

Figure 2:
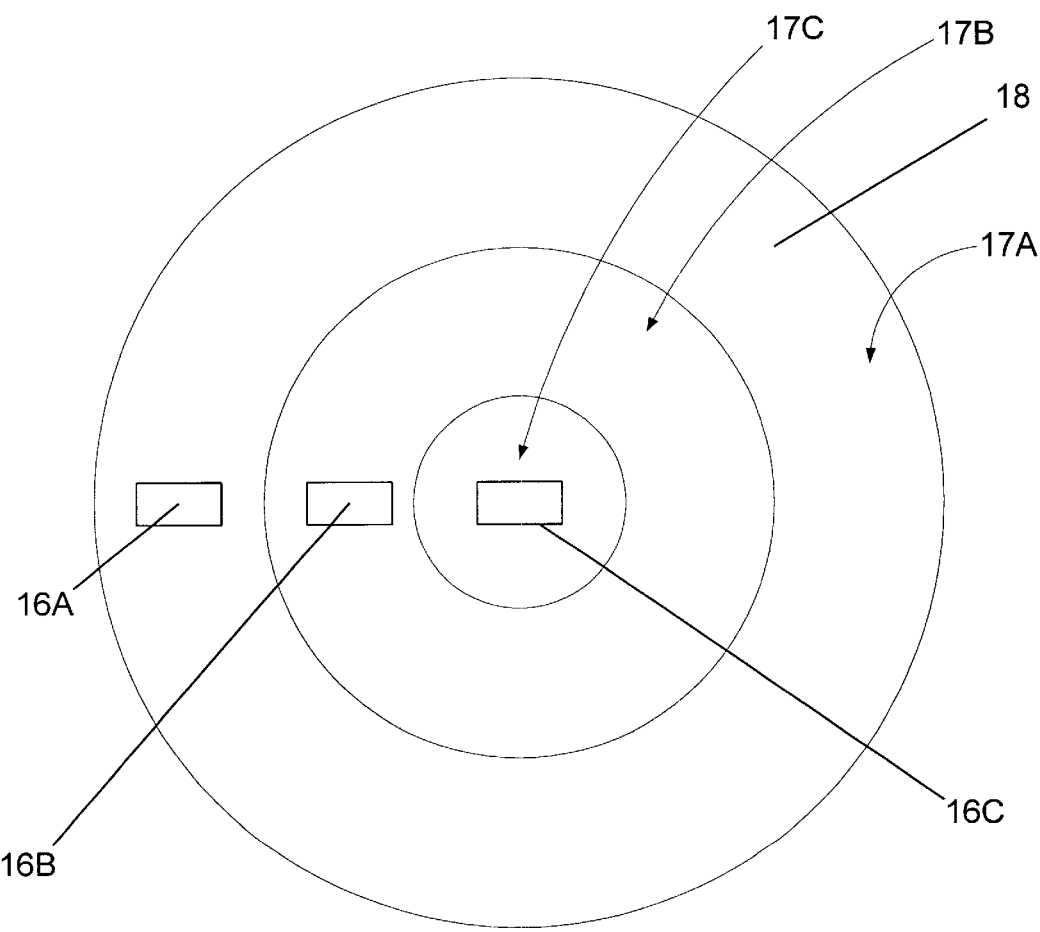
FIG. 2 is a bottom view of the semiconducting substrate depicted in FIG. 1.

FIG. 1 depicts an illustrative semiconducting substrate or wafer 10 at a point during the manufacturing process where a patterned process layer 12 and a patterned layer of photoresist 14 have been formed above an upper surface 13 of the substrate 10. FIG. 2 is a view of the bottom surface 18 of the device shown in FIG. 1. The substrate 10 may be considered to have an edge region 17A, a center region 17C, and a middle region 17B disposed between the edge region 17A and the center region 17C. A plurality of temperature sensors 16A–16C are, in the illustrative embodiment shown in FIG. 2, associated with regions 17A–17C, respectively. However, as will become clear based upon a reading of the present application, the present invention may be practiced using only one temperature sensor.

With respect to FIG. 1, the patterned process layer 12 may be formed from a variety of materials used in semiconductor manufacturing operations, e.g., an oxide, an oxynitride, a nitride, silicon dioxide, silicon nitride, silicon oxynitride, polycrystalline silicon (polysilicon), a metal, e.g., aluminum, copper, tungsten, or other like materials. Moreover, the initially formed layer of material (not shown) from which the patterned layer of material is formed may be formed by a variety of techniques, e.g, thermal growth, chemical vapor deposition ("CVD"), physical vapor deposition ("PVD"), sputtering, etc. The patterned process layer 12 is meant to generically represent any type of process layer that may be patterned to define a feature in a semiconductor device, e.g., a gate insulation layer, a gate electrode, openings in interlayer dielectric materials for the formation of conductive interconnections, metal lines and plugs, etc. Lastly, although the patterned process layer 12 depicted in FIG. 1 is formed immediately on the upper surface 13 of the substrate 10, the present invention is not limited to process layers so formed. Rather, as will become clear after a complete reading of the present application, the present invention may be employed on process layers formed on top of pre-existing process layers or other previously fabricated structures.

The patterned layer of photoresist 14 may be comprised of any type of photoresist material, positive or negative, useful in photolithography processing operations. As set forth in the background section of this application, the structure depicted in FIG. 1 may result from initially forming a layer of material (not shown), e.g., polysilicon, across the entire upper surface 13 of the substrate 10, forming a layer of photoresist (not shown) above the previously formed layer of material, and producing the patterned layer of photoresist using known photolithography processing techniques. Thereafter, the patterned process layer 12 may be formed by performing one or more etching processes, e.g., wet or dry, anisotropic or isotropic, using the patterned layer of photoresist 14 as a mask. These illustrative process steps will result in the structure depicted in FIG. 1.

The sensors 16A–16C may be any device that is capable of sensing the temperature or temperature changes in the substrate 10, e.g., a thermocouple, an optical pyrometer. The temperature sensors 16A–16C may be contact or non-contact devices. For example, the sensors 16A–16C may be optical pyrometers that are commonly employed in rapid thermal anneal processing chambers to sense the temperature of the wafer during anneal processes. Additionally, the sensors 16A–16C may be of the contact type that may be, at least temporarily, coupled to the substrate 10 in any manner that allows the sensors 16A–16C to effectively sense the temperature of the substrate 10. For example, in the illustrative example where the sensors 16A–16C are thermocouples, they may be positioned in an etching tool in which the photoresist removal process will be performed such that they are coupled to the bottom surface 18 of the substrate 10 when the wafer 10 is positioned in the etching tool.

The number and location of the sensors 16A–16C may vary depending upon the desired degree of control, the composition and purpose of the process layer or device under construction, etc. In the illustrative embodiment depicted in FIGS. 1 and 2, three sensors 16A–16C are used, and they are arranged along an approximately radial line that extends outwardly from the center region 17C of the substrate 10. In the depicted embodiment, the sensor 16A may be used to sense the temperature of the edge region 17A of the substrate; the sensor 16C may be used to sense the temperature of the center region 17C of the substrate 10; and the sensor 16B may be used to sense the temperature of the middle region 17B of the substrate 10. Of course, different patterns and numbers of sensors may be used.

At some point during the fabrication process, the photoresist layer will be removed by an etching process, e.g., ashing, plasma strip, etc. During the course of the etching or stripping process, as the photoresist layer 14 is removed, the temperature of the underlying process layer 12, and ultimately the substrate 10, increases. When all of the photoresist has been removed, the temperature decreases from its peak level. Thus, the temperature of the substrate 10, or temperature changes of the substrate 10, may be used as an indication of when all or substantially all of the photoresist layer 14 has been removed. Moreover, by using the temperature of the substrate to endpoint the stripping process, spatial variations in the removal of the photoresist layer across the surface of the substrate 14 may be determined, and appropriate process adjustments may be made to account for, or compensate for, this spatial variation.

Determining of the endpoint of the photoresist removal process based upon the temperature of the substrate 10 will require establishment of a set of rules or protocols, which may vary, depending upon the device under construction, the stage of manufacturing, etc. For example, a protocol may be established whereby the temperature of the substrate 10 is sensed by the sensors 16A–16C during photoresist removal, perhaps after a small delay time. For example, a baseline temperature of the substrate may be established as the average measured temperature between approximately 5 seconds and 10 seconds after the plasma is initiated. Thereafter, the endpoint may be declared when the sensed temperature, provided by sensors 16A–16C, indicates an approximate 15–20% decrease in the temperature of the wafer 10 from the baseline temperature. Of course, the particular rules employed for declaring the endpoint based upon temperature will vary. Endpoint may be declared based on the temperature sensed in local regions of the substrate, or based upon an overall temperature of the substrate.

Figure 3:
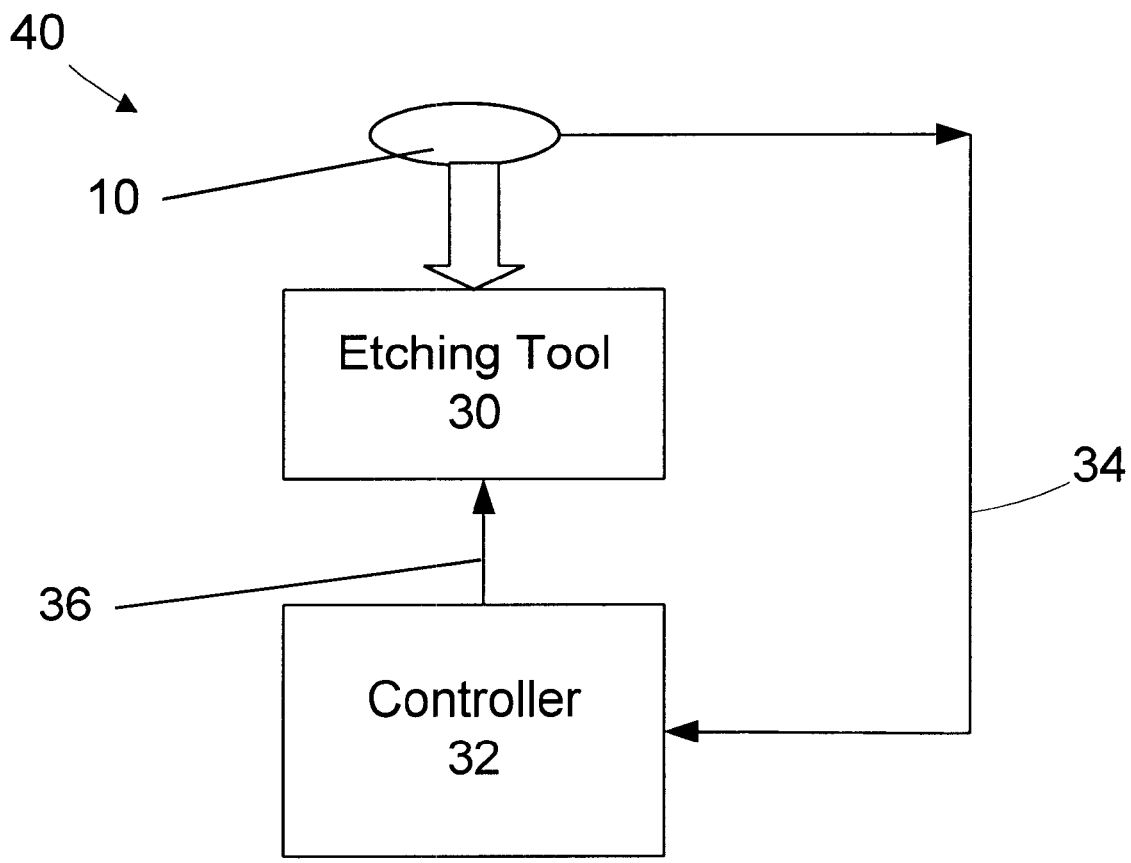
FIG. 3 depicts one illustrative embodiment of the system in which the present is invention may be employed.

An illustrative system 40 in which the present invention may be employed is depicted in FIG. 3. The system 40 is comprised of an etching tool 30, in which a wafer 10 is placed, and a controller 32. The etching tool 30 may be any type of process tool that may be used in stripping the patterned photoresist layer 14 after it is no longer useful or needed. For example, the etching tool 30 may be a plasma etching tool such as Model No. L3510, sold by Gasonics. The particular process recipe used for stripping the patterned layer of photoresist 14, e.g., power settings, duration, gas flows, environment, etc., should not be considered a limitation of the present invention unless specifically set forth in the appended claims.

The controller 32 may be resident on the etching tool 30, it may be a separate standalone computer, or it may be part of another control system. The controller 32 receives inputs from the sensors, e.g., sensors 16A–16C (not shown in FIG. 3), via input line 34. The controller 32 then issues commands to adjust one or more parameters of the etching recipe to be used by the etching tool 30 on the wafer 10. If desired, this technique may be employed on a real time basis. Alternatively, the controller 32 may use the information collected during the processing of the wafer 10 depicted in FIG. 3 to adjust the etching recipe for a wafer to be subsequently processed.

In the illustrated embodiment, the automatic process controller 32 is a computer programmed with software to implement the functions described. However, as will be appreciated by those of ordinary skill in the art, a hardware controller designed to implement the particular functions may also be used. Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the automatic process controller 32, as described, is the ObjectSpace Catalyst system offered by ObjectSpace, Inc. The ObjectSpace Catalyst system uses Semiconductor Equipment and Materials International (SEMI) Computer Integrated Manufacturing (CIM) Framework compliant system technologies and is based the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

The system 40 may be used to compensate for spatial variations in the removal of the photoresist layer 14. For example, the situation may be such that the removal of the photoresist layer 14 in the center region 17C of the substrate 10 is substantially complete before the removal of the photoresist layer 14 in the edge region 17A of the substrate 10. In that situation, the controller 32 is advised, via line 34, of the endpoint condition being satisfied at the center region 17C of the substrate 10 that is detected by the sensor 16C, indicating the completion of the photoresist removal process in the center region 17C. Once detected, one or more parameters of the etching process, e.g., power setting, gas flow rates, pressure, may be varied to account for, or adjust to, spatial variations in the removal of the photoresist. That is, one or more parameters may be varied to reduce or eliminate the etching process in the center region 17C of the substrate 10. Alternatively, or in addition, one or more process parameters of the etching process may be varied to increase the removal rate of the photoresist layer 14 in the edge region 17A of the substrate.

For example, the power setting of the etching process may be decreased to reduce the etching process at the center region 17C of the substrate 10. Alternatively, the power setting of the etching process may be increased to increase the removal rate of the photoresist layer 14 at the center region 17C of the substrate. The magnitude of the adjustments, as well as the parameter adjusted, will vary depending upon a variety of factors, such as the thickness of the layer of photoresist, the stage of fabrication, the device under construction, etc. Similarly, the gas flow rates and pressure may be changed to modify the removal rate at the center region 17C of the substrate 10 relative to the removal rate at the edge region 17A of the substrate 10.

Figure 4:
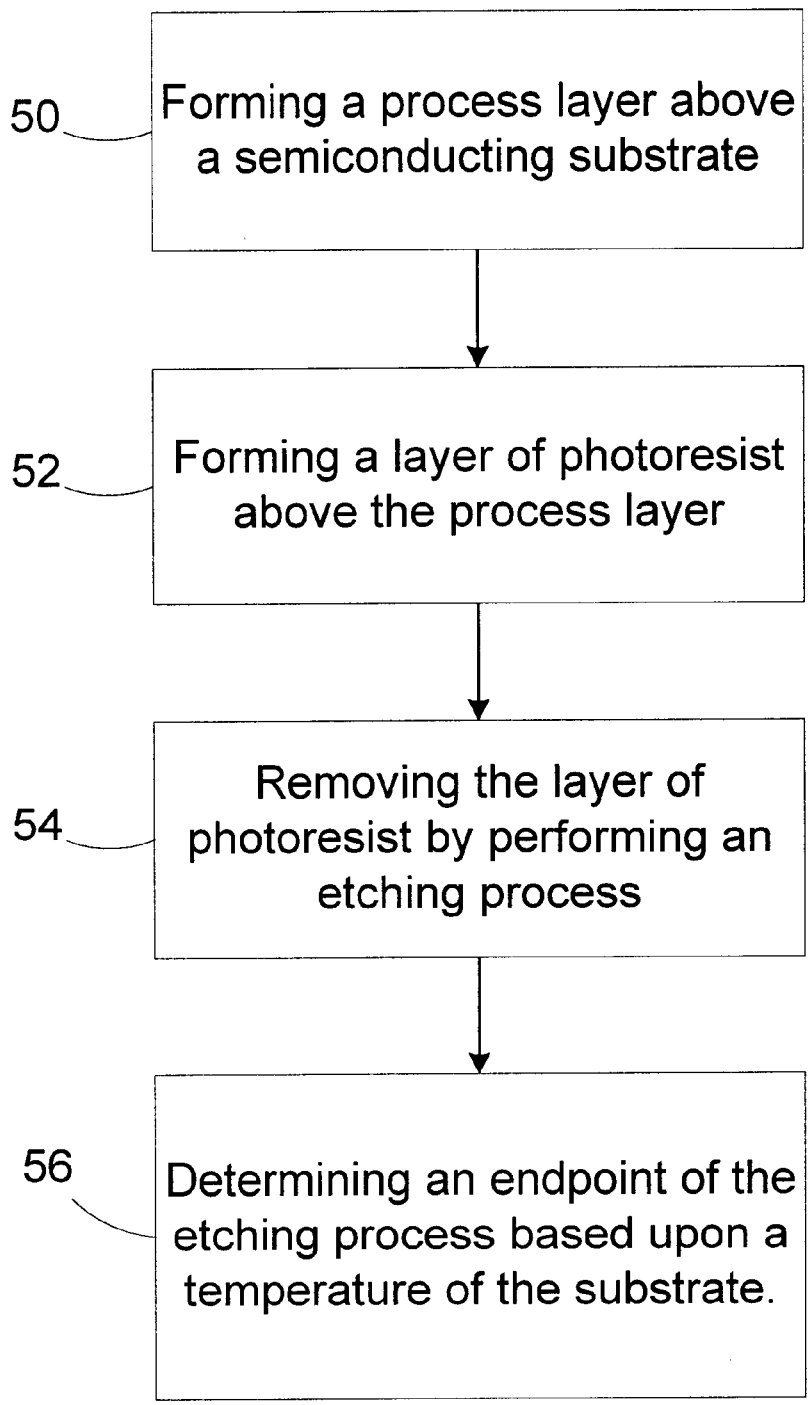
FIG. 4 depicts one illustrative embodiment of the method of the present invention in flowchart form.

Through use of the present invention, endpointing of photoresist stripping operations may be based upon the temperature of the wafer. FIG. 4 depicts one illustrative embodiment of the present invention in flowchart form. The method comprises forming a process layer above a semiconducting substrate, as indicated at block 50, and forming a layer of photoresist above the process layer, as indicated at block 52. The method further comprises removing the layer of photoresist by performing an etching process, as indicated at block 54, and determining an endpoint of the etching process based upon a temperature of the substrate, as indicated at block 56.

As set forth above, the process layer referenced at block 52 may be any type of process layer, e.g., oxides, polysilicon, metals, etc., and the process layer may be formed by a variety of techniques, e.g., thermal growth, deposition, etc. Moreover, the process layer may be formed on the surface 13 of the substrate 10, or on or above previously formed process layers or structures.

Thereafter, as indicated at block 52, a layer of photoresist is formed above the process layer referenced at block 52. In the disclosed embodiment, the photoresist layer 14 is a layer of photoresist that has been patterned using known photolithography processing techniques. Next, as indicated at block 54, all, or substantially all, of the layer of photoresist 14 is removed by an etching process, e.g., a plasma strip or ashing process. The particular etching tool 30 or recipe used to perform the removal process should not be considered a limitation of the present invention unless it is specifically set forth in the appended claims.

The step of determining the endpoint of the etching process based upon a temperature of the substrate, as set forth in block 54, may be performed in a variety of ways. For example, only one sensor may be employed, and the endpoint of the etching process may be based upon the temperature sensed by the single sensor. Alternatively, the endpoint may be determined based on temperatures determined by a plurality of temperature sensing devices coupled to the substrate.

In yet another embodiment of the present invention, the endpoint of the etching process may be detected in various regions of a wafer based upon input from sensors associated with those specific regions. For example, the sensors 16A, 16B and 16C may be used to detect the temperature of the substrate 10 in the edge region 17A, middle region 17B, and center region 17C, respectively. Thereafter, based on temperature inputs received from the sensors 16A–16C, parameters of the etching process may be varied to account for, or compensate for, variations in the removal rate of the layer of photoresist 14 across the surface of the substrate 10.

Through use of the present invention, the endpoint of a photoresist stripping process may be determined based upon the temperature of the substrate. The present method may be used to provide useful information as to differences in the removal of the layer of photoresist across the surface of the substrate. In turn, this information may be used to avoid exposing the underlying process layer to the photoresist stripping process for a longer duration than necessary, thereby helping to avoid or reduce potential damage to the process layer, components fabricated from the process layer, and the finished semiconductor device.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method comprising:
   forming a process layer above a semiconducting substrate;
   forming a layer of photoresist above said process layer;
   removing said layer of photoresist by performing an etching process; and
   determining an endpoint of said etching process based upon a temperature of said substrate.

2. The method of claim 1, wherein forming a process layer above a semiconducting substrate comprises forming a process layer comprised of at least one of an oxide, an oxynitride, polysilicon, and a metal above a semiconducting substrate.

3. The method of claim 1, wherein forming a layer of photoresist above said process layer comprises forming a patterned layer of photoresist above said process layer.

4. The method of claim 1, wherein removing said layer of photoresist by performing an etching process comprises removing said layer of photoresist by performing a plasma etching process.

5. The method of claim 1, wherein determining an endpoint of said etching process based upon a temperature of said substrate comprises determining an endpoint of said etching process based upon temperature readings obtained from a plurality of temperature sensors.

6. The method of claim 1, wherein determining an endpoint of said etching process based upon a temperature of said substrate comprises:
   establishing a baseline temperature for said substrate; and
   declaring process endpoint when the temperature of said substrate is approximately 15–20% less than said baseline temperature.

7. The method of claim 6, wherein establishing a baseline temperature for said substrate comprises determining an average temperature of said substrate during a period between approximately 5–10 seconds after the etching process is initiated.

8. The method of claim 1, wherein determining an endpoint of said etching process based upon a temperature of said substrate comprises determining an endpoint of said etching process based upon temperature readings obtained from a plurality of optical pyrometers.

9. The method of claim 1, wherein determining an endpoint of said etching process based upon a temperature of said substrate comprises determining an endpoint of said etching process based upon temperature readings obtained from a plurality of temperature sensors coupled to a bottom surface of said substrate.

10. The method of claim 1, wherein determining an endpoint of said etching process based upon a temperature of said substrate comprises determining an endpoint of said etching process based upon a temperature reading obtained from a single optical pyrometer.

11. The method of claim 1, wherein determining an endpoint of said etching process based upon a temperature of said substrate comprises determining an endpoint of said etching process based upon temperature readings obtained from a plurality of temperature sensors arranged along an approximate radial line of said substrate.

12. A method comprising:
   forming a process layer above a semiconducting substrate;
   forming a layer of photoresist above said process layer;
   sensing the temperature of said substrate;
   performing a plasma etching process to remove said layer of photoresist; and
   determining an endpoint of said plasma etching process based upon the sensed temperature of said substrate.

13. The method of claim 12, wherein forming a process layer above a semiconducting substrate comprises forming a process layer comprised of at least one of an oxide, an oxynitride, polysilicon, and a metal above a semiconducting substrate.

14. The method of claim 12, wherein forming a layer of photoresist above said process layer comprises forming a patterned layer of photoresist above said process layer.

15. The method of claim 12, wherein determining an endpoint of said plasma etching process based upon the sensed temperature of said substrate comprises determining an endpoint of said plasma etching process based upon temperature readings obtained from a plurality of temperature sensors.

16. The method of claim 12, wherein determining an endpoint of said plasma etching process based upon the sensed temperature of said substrate comprises:

establishing a baseline temperature for said substrate; and declaring process endpoint when the temperature of said substrate is approximately 15–20% less than said baseline temperature.

17. The method of claim 16, wherein establishing a baseline temperature for said substrate comprises determining an average temperature of said substrate during a period between approximately 5–10 seconds after the etching process is initiated.

18. The method of claim 12, wherein sensing the temperature of said substrate comprises sensing the temperature of the substrate at a plurality of locations on said substrate and wherein determining the endpoint of said plasma etching process based upon the sensed temperature of said substrate comprises determining an endpoint of said plasma etching process based upon the temperatures at the plurality of locations on said substrate.

19. A method comprising:

forming a process layer above a semiconducting substrate;

forming a layer of photoresist above said process layer;

sensing the temperature of the substrate within at least three localized regions of the substrate;

performing a plasma etching process to remove said layer of photoresist; and determining an endpoint of said plasma etching process based upon the sensed temperature of said substrate in each localized region of said substrate.

20. The method of claim 19, wherein forming a process layer above a semiconducting substrate comprises forming a process layer comprised of at least one of an oxide, an oxynitride, polysilicon, and a metal above a semiconducting substrate.

21. The method of claim 19, wherein forming a layer of photoresist above said process layer comprises forming a patterned layer of photoresist above said process layer.

22. The method of claim 19, wherein sensing the temperature of the substrate is comprised of sensing the temperature of the substrate within at least three localized regions of the substrate arranged along a radial line of said substrate.

23. The method of claim 19, wherein determining an endpoint of said plasma etching process based upon the sensed temperature of said substrate in each localized region of said substrate comprises:

establishing a baseline temperature for said substrate; and declaring process endpoint when the temperature of said substrate is approximately 15–20% less than said baseline temperature.

24. The method of claim 23, wherein establishing a baseline temperature for said substrate comprises determining an average temperature of said substrate during a period between approximately 5–10 seconds after the etching process is initiated.

* * * * *